US012693331B2

(12) United States Patent (10) Patent No.: US 12,693,331 B2

Epping et al. (45) Date of Patent: ***Jul. 28, 2026

(54) TEST ARRANGEMENT AND METHOD FOR EMULATING THE PHASE CURRENTS OF AN ELECTRIC MOTOR FOR TESTING A POWER ELECTRONICS CONTROLLER

(71) Applicant: dSPACE GmbH, Paderborn (DE)

(72) Inventors: Daniel Epping, Paderborn (DE); Philipp Kemper, Paderborn (DE)

(73) Assignee: dSPACE GmbH, Paderborn (DE)

( * ) Notice: Subject to any disclaimer, the term of this patent is extended or adjusted under 35 U.S.C. 154(b) by 182 days.

This patent is subject to a terminal disclaimer.

(21) Appl. No.: 18/540,347

(22) Filed: Dec. 14, 2023

(65) Prior Publication Data

US 2024/0201248 A1     Jun. 20, 2024

(30) Foreign Application Priority Data

Dec. 14, 2022    (DE) ..................... 10 2022 133 309.4

(51) Int. Cl.
    *G01R 31/34*        (2020.01)
    *G01R 31/28*        (2006.01)
    *H02K 11/33*        (2016.01)
(52) U.S. Cl.
    CPC ..... *G01R 31/2848* (2013.01); *G01R 31/2829* (2013.01); *G01R 31/2837* (2013.01); *G01R 31/2839* (2013.01); *H02K 11/33* (2016.01)
(58) Field of Classification Search
    CPC ........... G01R 31/2829; G01R 31/2837; G01R 31/2839; G01R 31/2848; G01R 31/42; G01R 31/343; H02K 11/33
    See application file for complete search history.

(56) References Cited

U.S. PATENT DOCUMENTS

| | | | |
|---|---|---|---|
| 9,857,820 B2 | 1/2018 | Bracker et al. | |
| 10,628,540 B2 | 4/2020 | Meyer | |
| 10,886,833 B2 * | 1/2021 | Liang | H02M 3/158 |
| 2016/0314230 A1 * | 10/2016 | Dufour | G06F 30/367 |
| 2018/0123497 A1 * | 5/2018 | Holthaus | G05B 17/02 |
| 2018/0175733 A1 * | 6/2018 | Hartman | H02M 3/156 |
| 2021/0033659 A1 * | 2/2021 | Roche | G01R 31/2893 |
| 2021/0036646 A1 * | 2/2021 | Sul | G05B 17/02 |

FOREIGN PATENT DOCUMENTS

| | | |
|---|---|---|
| DE | 102005048464 B4 | 4/2007 |
| DE | 102012111051 A1 | 5/2014 |
| EP | 3196714 A1 | 7/2017 |

* cited by examiner

*Primary Examiner* — Thang X Le

(74) *Attorney, Agent, or Firm* — Muncy, Geissler, Olds & Lowe, P.C.

(57) ABSTRACT

A test arrangement for emulating the phase currents of an electric motor for testing a power electronics controller. The controller is set up to drive the electric motor and is connectable to the test arrangement. The test arrangement includes an inductance emulator which simulates the electric motor as an electrical load for the controller by means of a power electronics circuit, and includes a test device that is set up to switch the inductance emulator to a different operating mode depending on an analysis of an output voltage at an output of the controller. A method is also provided for emulating the phase currents of an electric motor by means of a test arrangement for testing a controller.

18 Claims, 5 Drawing Sheets

TEST ARRANGEMENT AND METHOD FOR EMULATING THE PHASE CURRENTS OF AN ELECTRIC MOTOR FOR TESTING A POWER ELECTRONICS CONTROLLER

This nonprovisional application claims priority under 35 U.S.C. § 119(a) to German Patent Application No. 10 2022 133 309.4, which was filed in Germany on Dec. 14, 2022, and which is herein incorporated by reference.

BACKGROUND OF THE INVENTION

Field of the Invention

The application relates to a test arrangement and a method for emulating the phase currents of an electric motor for testing a power electronics controller.

Description of the Background Art

Devices for carrying out control and/or regulation tasks in vehicles are also referred to as controllers. Controllers in vehicles, especially motor vehicles, may have a processing unit, memory, interfaces and possibly other components that are necessary for the processing of input signals with input data into the controller and the generation of control signals with output data. The interfaces are used to record the input signals and output the control signals.

In battery-electric vehicles, there is a so-called engine controller, which supplies the drive motor with electrical energy from a battery, e.g., a traction battery. The engine controller has an inverter that converts DC voltage provided by the battery into AC voltage that supplies the motor.

To test the engine controller, emulators are provided that simulate the behavior of the motor by providing the engine controller with electrical currents that simulate the phase currents of the different windings of the motor.

If the inverter of the engine controller is switched off or if the semiconductor circuit breakers are switched non-conductive for some other reason, this condition is called inverter lockout. For this condition, a realistic emulation of the motor is desired.

SUMMARY OF THE INVENTION

It is therefore an object of the invention to provide a test arrangement for the emulation of the phase currents of an electric motor is proposed for testing a power electronics controller which is set up to drive the electric motor and can be connected to the test arrangement.

In an example, the test arrangement comprises an inductance emulator that simulates the electric motor as an electrical load for the controller by means of a power electronics circuit and a test device set up to switch the inductance emulator to a different mode of operation depending on an analysis of an output voltage at one output of the controller.

Such a test arrangement for emulating the phase currents can also be called a simulator.

Furthermore, a method for emulating the phase currents of an electric motor by means of a test arrangement for testing a power electronics controller which is set up to drive the electric motor and which can be connected to the test arrangement is provided. The method includes an inductance emulator that simulates the electric motor as an electrical load for the controller by means of a power electronics circuit, and a test device that is set up to switch the inductance emulator to a different operating mode depending on an analysis of an output voltage of the controller.

The test arrangement or method for emulating the phase currents of the electric motor for testing a power electronics controller has the advantage that certain operating modes of the controller can be reliably detected by analyzing an output voltage at an output of the controller, such as the inverter lock. In particular, this makes it possible to safely handle this inverter lock and its automatic detection. It is possible to automatically process this operating state of the inverter lock. It can also be avoided, for example, having to manually switch off the inductance emulator when the inverter lock is detected. As a result of the analysis, the inductance emulator can be switched to a different operating mode, for example, the inductance emulator can be switched off.

The test arrangement can have at least one inductance emulator that simulates the electric motor as an electrical load for the controller by means of a power electronics circuit. In particular, the test arrangement can have at least one inductance emulator per emulated motor phase.

The test device can be controlled in particular by the output voltage of the controller. The output voltage of the controller therefore provides the control values with which at least one inductance emulator of the test device is applied, so that the desired phase current is set as the electrical output variable. The phase current can be derived from the output voltage of the controller, e.g., by calculating corresponding mathematical motor models of the at least one inductance emulator of the test device. For this purpose, the real electrical quantities at the input are recorded by measurement, further processed within the framework of the mathematical models, taking into account the output variables desired by the model, and corresponding control sequences, i.e., sequences of control values, are calculated for the circuit breakers contained in the power electronics circuit and applied to the power electronics circuit.

An inverter lock may mean that the circuit breakers, which are arranged in half-bridges of the inverter in the controller, are locked. It should be noted that if such a half-bridge is switched off, the current that is delivered from the inductance emulator to the controller only degrades to zero after a certain period of time, because in the case of an electric motor, its inductors store energy, which is dissipated as freewheel current via the freewheel diodes. The freewheel diodes are parallel to the transistors. They can be integrated with the transistors or as separate diodes parallel to the transistors. The inductance emulator can be used to simulate this freewheel current. In order to achieve sufficient dynamics, the inductance emulator is supplied with a higher voltage than the controller. This is supplied with the battery voltage. The battery voltage can be generated via a battery emulator. Therefore, the inductance emulator can then control the freewheel current via the freewheel diode according to a model value. However, once the current has dissipated, the inductance emulator must set a current of exactly zero in order to realistically replicate the behavior of the simulated inductors. However, a small deviation from ideal zero causes either the upper or lower freewheel diode to become conductive. This results in a fault current. At the same time, when a freewheel diode becomes conductive, the voltage jumps above either the upper or the lower potential of the DC link voltage. Feedback with the mathematical model of the inductance emulator of the test arrangement can then lead to an upward and downward oscillation of the emulated current and thus also to a corresponding vibration behavior of the output voltage of the controller. A correct emulation of the current is therefore not possible. This is remedied by the proposal set out in this application. According to the application, the operating status of the inverter lock is detected on the basis of the potential curve at the output of the controller, i.e., on the basis of the output voltage of the controller. If the inverter lock is detected, the current control of the inductance emulator is switched to a different operating mode.

The test arrangement can be a device that is intended to test the function of controllers, in particular power electronics controllers. To achieve this, the test arrangement emulates an electric motor to the controller through its phase currents, so that it is possible to test the controller in different situations without having to connect an actual electric motor to the controller. This is more cost-effective and efficient than actually having to attach an electric motor. However, the controller can also be connected to an emulation of a battery or, in rarer cases, a battery, so that the controller can be tested for all possible situations by the connected devices. All functions that are on the controller, for example stored in an electronic memory, can also be tested in a simple manner.

The emulation of the phase currents may mean that those phase currents are emitted from the test arrangement to the controller that match the control by the controller. This means that the test arrangement outputs the currents that an electric motor would output in the respective operating state. The test arrangement can also be called an emulator. This can be used to test a power electronics controller for controlling an electric motor. Such power electronics controllers are used, for example, in electric vehicles. The core component of such controllers is a bridge circuit with semiconductor circuit breakers, such as power transistors. For example, the bridge circuit can be called an inverter.

For example, an AC electric motor can be emulated. Such an alternating current electric motor, for example, has three or six phases. More or less phases are also possible. Depending on the type of motor, the number of phases can vary, e.g., five, seven, etc. are also possible. The test arrangement is set up to simulate at least one phase, but also several phases or all phases.

DC motors can also be emulated and are controlled by two-phase half-bridge topologies. The test arrangement is set up to simulate such phases of a DC electric motor. In the case of a DC electric motor, the term inverter for the controller is then to be interpreted as a generic term that also includes power converters with direct current/direct current conversion.

The power electronics controller, for example, is a controller that can convert the DC voltage from the battery into an AC voltage. For this purpose, the controller has at least a bridge circuit, which can also be called an inverter, which is usually controlled with pulse width modulation. The power electronics controller may also be designed to convert direct voltage into direct voltage, in particular by means of a bridge circuit. This is then intended for the control of a DC electric motor.

The controller also has other functions such as self-tests or test functions for the electric motor or the connected devices, which can be accessed, for example, via a communication interface, for example via a CAN bus. Therefore, in addition to the inverter, the controller also can have a communication interface and, for example, a microcontroller that performs the function of the controller.

Depending on an analysis of a parameter that depends on the output voltage of the controller, the test device switches the inductance emulator to a different operating mode at the output of this controller in the presence of predetermined conditions. This can be, for example, a shutdown. In particular, the parameter that depends on the output voltage of the controller can be the phase current generated by the inductance emulator as a function of the output voltage of the controller.

However, the test device continues to analyze the parameter depending on the output voltage of the controller even after the inductance emulator is switched to the other operating mode. In doing so, the test device monitors the parameter depending on the output voltage of the controller in order to switch the inductance emulator back to another operating mode, e.g., the previous one, if the parameter changes accordingly, i.e., the so-called inverter lock is no longer present, in which the inductance emulator is no longer allowed to generate phase current.

Therefore, operating mode can be understood to be the normal operation of the inductance emulator, in which the inductance emulator provides the phase currents as a function of the output voltage of the controller, as well as an operating mode in which the inductance emulator is in the other operating mode. For example, in the other operating mode, no phase current can be generated, i.e., the inductance emulator is switched off. It is also possible for the inductance emulator to regulate its currents in such a way that a voltage is formed over the DC link capacitance of the controller. This provides the controller with the supply voltage through which it can adjust the phase currents. For example, when used in conjunction with an auxiliary capacitance, the inductance emulator can also act as a voltage source. This is advantageous, for example, when detecting the inverter lock.

The same applies to the method of emulating the phase currents of an electric motor.

The test device not only has a logic in software and/or hardware to detect the so-called inverter lock, but also another logic that detects, for example, on the basis of the output voltage of the controller, what current the electric motor would then output for this particular output voltage. For example, the test device has a model, in particular a motor model, that establishes these relationships between the output voltage of the controller and the current that the inductance emulator outputs to the controller. This model is, e.g., stored in an electronic memory.

In order to efficiently test the functionality of electronic controllers, such test arrangements or simulations are used to test the controller in a wide variety of situations to ensure that it is functioning as intended. The system formed of the test device, the controller and, if necessary, the battery connected to the controller can therefore be described as a hardware-in-the-loop (HiL) setup. The controller is not only addressed at signal level by the test device, but the power connections are also stimulated. Therefore, the setup can also be called a power hardware-in-the-loop emulator (Power-HiL). The hardware to be tested, e.g., the engine controller with battery, if applicable, can be referred to as the "device under test".

It is suggested that the other mode of operation is to turn off the inductance emulator. It is then deactivated, i.e., switched off, and the output of the inductance emulator becomes high-impedance. Therefore, after the reduction of a current flowing in a possible output inductance, a current of 0 A is established and the condition is fulfilled that when a so-called inverter lock of the controller is detected, no further current is supplied to the controller by the inductance emulator. Further, it is possible to switch to an operating mode in which the inductance emulator acts as a voltage source.

For example, if the controller is in an operating mode in which electrical energy is supplied to the connected electric motor as alternating voltage, the circuit breakers of each half-bridge can be switched on in a cyclically alternating manner, for example. This is known as pulse-width modulation operation, or PWM operation for short. In PWM operation of the controller, there is exactly one potential change of the output voltage of the controller in a defined time interval. The characteristic time interval depends on the PWM frequency of the controller. Through the pulse width modulation of the circuit breakers, an output voltage of the controller is modulated from the DC voltage of the battery, which imprints the desired sinusoidal currents into the motor winding.

The inductance emulator can act as a power source. For example, the test arrangement has a power electronics circuit that has parallel half-bridges. Two half-bridges assigned to each other form a bridge. Several bridges can be connected in parallel and together generate the phase current for one phase of the electric motor. The respective half-bridges can have several stages with semiconductor circuit breakers. The stages can be used to influence the amount of current emitted. The power electronics circuit can act as a responsive power source.

This means that the inductance emulator can be operated as a power source, which is regulated by the test device depending on an analysis of a parameter that depends on an output voltage of the controller, e.g., by switching it to a different operating mode. In particular, the inductance emulator can be switched off in the other operating mode or act as a voltage source. The current level emitted by the inductance emulator can also be adjusted, for example, depending on the output voltage of the controller, e.g., via the power semiconductor circuit breakers of the half-bridges.

To emulate the phase currents, an inverter can also be used, which converts the supply voltage applied to the inductance emulator into an alternating voltage. This inverter is then the claimed power electronics circuit.

The test arrangement may be set up to feed a current into the output of the controller that depends on the output voltage of the controller and that has been generated by the inductance emulator. As already shown above, the inductance emulator feeds the current into the controller to reliably simulate the behavior of an electric motor during operation as a function of the output voltage of the controller.

For example, the other mode of operation in which inductance emulation can be switched can be a shut-down of the inductance emulator. It is also possible to switch to an operating mode in which the inductance emulator acts as a voltage source.

It is also proposed that the test device has a threshold decider, which is set up to compare a parameter dependent on the output voltage of the controller with at least one threshold value, wherein the test device is set up to switch the inductance emulator to the other mode of operation depending on this comparison. Such a threshold decider, which can be hardware and/or software-based, can be used to reliably determine whether the output voltage of the controller or a parameter dependent on it has a value that indicates, for example, a so-called inverter lock. This can be detected with predefined thresholds. The parameter depending on the output voltage of the controller can be, for example, the current supplied by the test device to the controller.

In addition, it is proposed that the threshold decider is set up to compare the parameter dependent on the output voltage of the controller, in particular the current emitted by the test device, with two threshold values lying on different sides of a zero crossing of the variable. In this way, regardless of the polarity, it is examined in terms of amount whether the variable, e.g., indicates an inverter lockout.

Further, it is suggested that the test device is set up to switch the inductance emulator to the other mode of operation if the parameter is between the two thresholds. If the two threshold values are symmetrical around a zero crossing of the variable, then it can be reliably concluded from this state that, for example, an inverter lock is present.

The test device can be set up to compare a further parameter dependent on the output voltage of the controller with another threshold value and, depending on this comparison, to switch the inductance emulator out of the other operating mode. The other parameter can be in particular the output voltage of the controller or a corresponding measuring voltage. Consequently, there is another threshold value, which is applied in particular when the inductance emulator has been switched to the other operating mode due to an inverter lockout. Then, i.e., even after the inductance emulator has been switched to the other state, the test device continues to monitor the output voltage of the controller or the measuring voltage, for example whether the controller leaves the inverter lock again. If this is the case, then the further threshold value is exceeded again and the inductance emulator can be switched back to the original operating mode, i.e., the inductance emulator then delivers the phase current to the controller again.

It is also possible for the test device to have a resistor network connected to the output of the controller, wherein the resistor network draws the output voltage of the controller to a certain potential when the inductance emulator is switched off. The resistor network can be used to ensure that the output voltage of the controller assumes a defined, predetermined potential in the case of an inactive inductance emulator and an inactive controller at the same time. For the example described, this is a range around 0V and smaller than the further threshold value. The defined potential simplifies the detection of the inverter lock.

The resistor network can have at least one resistor, through which the test device detects the output voltage of the controller or the associated measuring voltage.

The resistor network can also have two resistors that are connected symmetrically to the output, wherein the two resistors, for example, can have the same resistance value.

The resistor(s) can be dimensioned in such a way that they do not cause high losses in normal operation but at the same time are small enough to be able to draw the output voltage of the controller to the desired defined potential in a short time.

The inductance emulator can be connected to the controller via an inductance network. The inductance network, formed of coupled inductors, has two basic functions. First of all, it is intended to prevent cross-currents between the parallel bridges of the circuit. It also serves as an inductive voltage divider to combine multiple discrete voltages in multi-level bridges. With the help of this voltage divider, a multi-level topology can be created when using bridges with several levels.

In addition, it is proposed that the power electronics circuit should have at least one bridge circuit with semiconductor circuit breakers as the circuit breakers, in particular three bridge circuits with semiconductor circuit breakers connected in parallel. If each half-bridge has several levels, then the current emitted by the inductance emulator is finely scalable in size. This is because scaling is possible depending on which semiconductor circuit breakers are closed or controlled accordingly in order to influence the current emitted. This makes it possible to apply different discrete voltages to the inductance network, which differ from their own DC link potential, in order to regulate the desired output current more dynamically and precisely. The semiconductor circuit breakers can be made of silicon carbide, for example, but also of other semiconductor materials suitable for power electronics, such as silicon, germanium or gallium nitride, etc.

As indicated above, it is possible for the test arrangement to have a specific inductance emulator and a specific test device for each phase of the electric motor.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
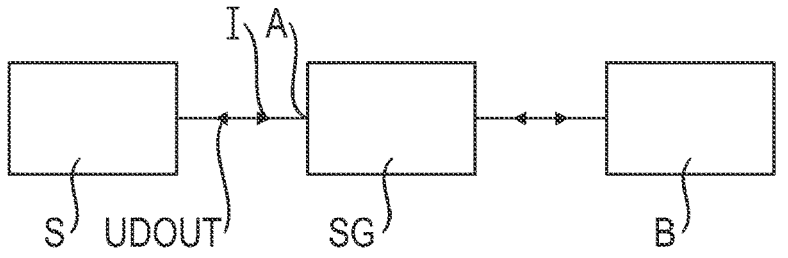
FIG. 1 shows a first block diagram of the test arrangement with connected devices.

FIG. 1 shows in a block diagram the overall arrangement on which the present application is based. The test arrangement S is connected to the controller SG in such a way that electrical signals are transmitted from the controller SG to the test arrangement S and vice versa. These electrical signals are currents or voltages. A battery B is connected to the controller SG, which supplies the controller SG with electrical energy, just as is the case in the vehicle. The battery B can be connected, for example, via a high-voltage board network or directly to the controller SG. The battery B can also be designed as an emulation of a battery B, so that the behavior of the controller SG can be tested with emulations on both sides.

The controller SG receives the electrical energy from the battery B in the form of direct voltage, which the controller SG converts into an alternating voltage with an inverter, which outputs the AC voltage UDOUT to an output A in order to drive an electric motor. In the present case, the electric motor is emulated by the test arrangement S.

It is possible for an emulation of the battery to be performed with the emulation of the phase currents on a piece of hardware. For example, the power electronics circuit used to emulate the phase currents can also emulate the battery B in combination with a capacitance. This allows for a complete emulation environment of the power and signal connections of the controller to be generated. The advantage here is that the transferred electrical energy can remain in the system.

The controller SG converts the DC voltage of the battery B into an AC voltage UDOUT by means of its inverter, which has at least two circuit breakers controlled by pulse width modulation. This AC voltage UDOUT is used to supply the test arrangement S. This is then used to test how the controller SG would control the electric motor simulated by the test arrangement S. The controller SG can be supplied with various control signals, which are not shown here, in order to simulate different driving situations. This way, the SG controller then shows how it would control the electric motor.

It has been recognized that the controller SG can assume an operating state called inverter lock. In this operating state of the inverter lock, both circuit breakers T1, T2 are open, wherein these two circuit breakers T1, T2 are each arranged in a half-bridge of the inverter. Such circuit breakers T1, T2 are, e.g., semiconductor circuit breakers, i.e., transistors that are designed to switch high currents.

The electric motor, in this case the inductance emulator IE, is not controlled in the case of the inverter lock and is therefore not supposed to deliver electricity I back. Therefore, the application proposes to reliably detect this operating state of the controller SG by means of the output voltage UDOUT of the controller SG. Depending on this, the test arrangement S can then switch off its inductance emulator IE by means of the test device PE or bring it into a different operating state in order to prevent the delivery of a phase current I to the controller SG.

Figure 2:
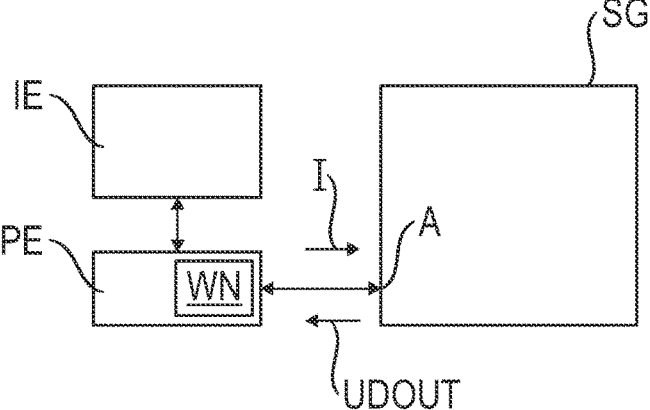
FIG. 2 shows a second block diagram of the test arrangement with connected controller.

FIG. 2 shows the test arrangement S in a block diagram. The test arrangement S has two components, namely the inductance emulator IE and the test device PE. For example, the inductance emulator IE emulates the electric motor by means of phase currents I, which the inductance emulator IE delivers to the SG controller. The test device PE controls the inductance emulator IE depending on the analysis of the parameter dependent on the output voltage UDOUT at the output A of the controller SG. The test device PE can use the resistor network WN as a voltage divider. If the test device PE detects that there is an inverter lockout, the controller SG is no longer pressurized with the phase current I from the inductance emulator IE, for example by the test device PE bringing the inductance emulator IE to a different operating state, e.g., by the test device PE switching off the inductance emulator IE.

Figure 3:
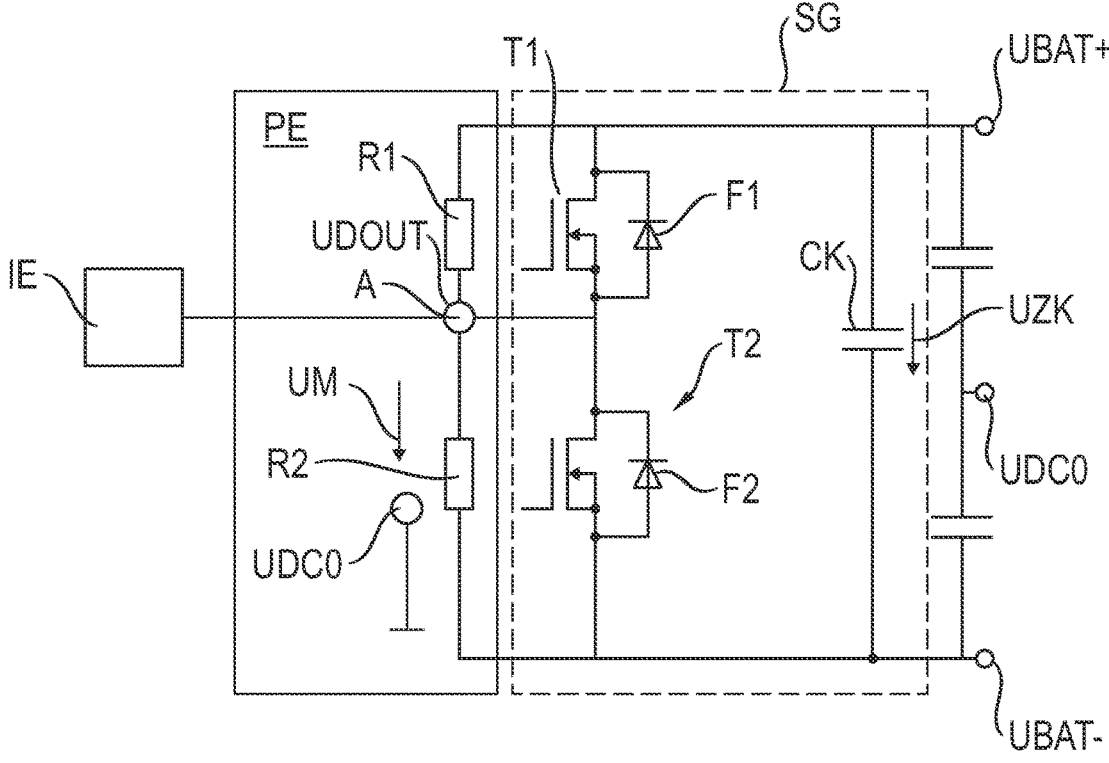
FIG. 3 shows a circuit diagram of the controller with connected inductance emulator and test device.

FIG. 3 shows in a circuit diagram how the controller SG is connected to the test device PE and also to the battery B. The controller SG has the resistor network WN, which has two transistors T1, T2. One transistor T1, T2 in each case is arranged in a half-bridge of the inverter bridge. The transistors T1 and T2, for example, are controlled by pulse width modulation in such a way that they output the AC voltage UDOUT at the output A. Parallel to the respective transistors T1 and T2, freewheel diodes F1 and F2 are switched. Parallel to the inverter bridge, a DC link capacitor CK is provided in the controller. It is used to measure the DC link voltage UCC. Parallel to the DC link capacitor CK, the emulated battery B is connected with the respective battery voltage potentials UBAT+ and UBAT−. The reference voltage UDC0, which can be grounded, for example, is switched in the middle.

At the output of the controller A, the voltage UDOUT is present. This voltage UDOUT is measured by the test device PE, for example by means of a measuring voltage UM, which depends directly on the voltage UDOUT, against the reference potential UDC0. The analysis of this measuring voltage UM corresponds to the analysis of the voltage UDOUT. For example, the measuring voltage UM can be a voltage over a voltage divider from the ohmic resistors R1 and R2 derived from the voltage UDOUT. This voltage divider from the ohmic resistors R1 and R2 is connected on the test device PE side in parallel to the inverter bridge of the controller SG. The inductance emulator IE is also connected to the output A to deliver the phase current I to the controller SG. The resistors R1, R2 form a resistor network over which the output A can be drawn to a defined potential—UDC0 in the example shown—when the inductance emulator IE is switched off and the controller SG is inactive.

Figure 4:
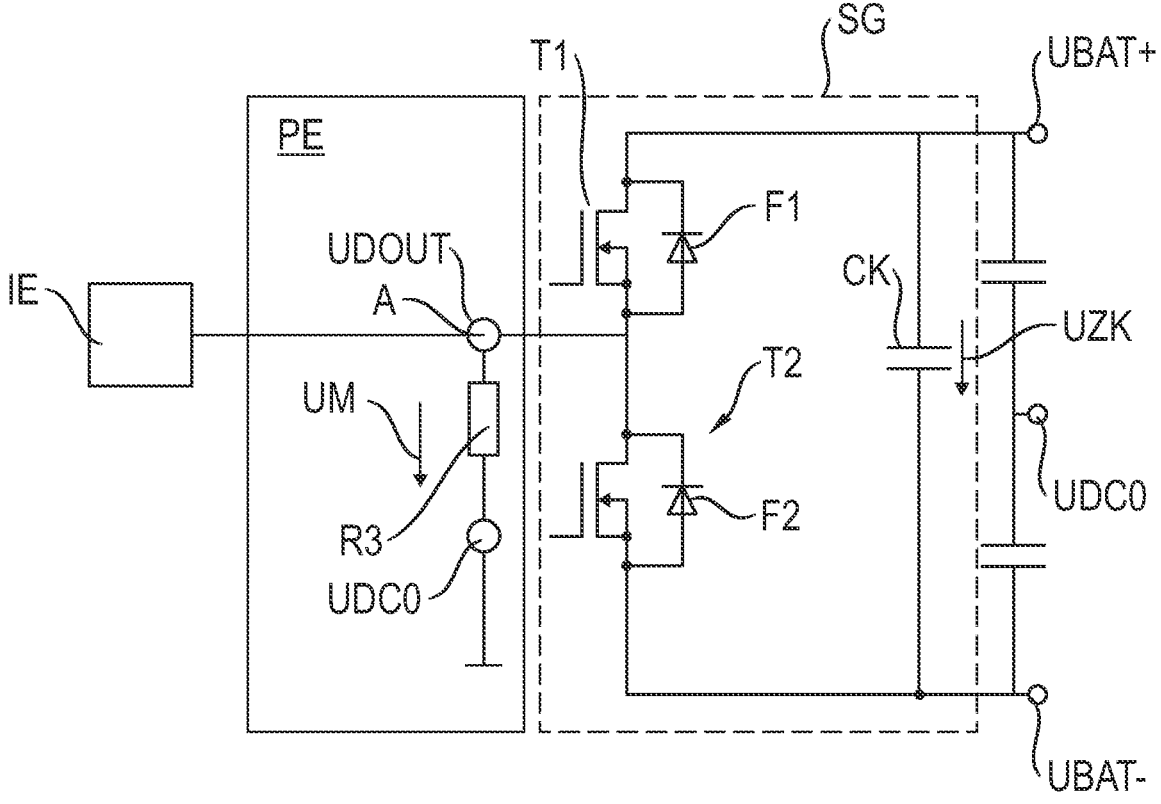
FIG. 4 shows another circuit diagram of the controller with connected inductance emulator and test device.

FIG. 4 shows a further example to FIG. 3, in which instead of the voltage divider formed of the ohmic resistors R1 and R2, only a resistor R3 is switched against a defined potential. At its other end, the resistor R3 is connected to the output A. Above the resistor R3, the measuring voltage UM is detected by the test device PE, which in the present case is equal to the output voltage UDOUT. The resistor R3 forms the resistor network WN, via which the output A can be drawn to the defined potential—UDC0 in the example shown—when the inductance emulator IE is switched off and the controller SG is inactive. Otherwise, the arrangement in FIG. 4 acts the same as in FIG. 3.

Figure 5:
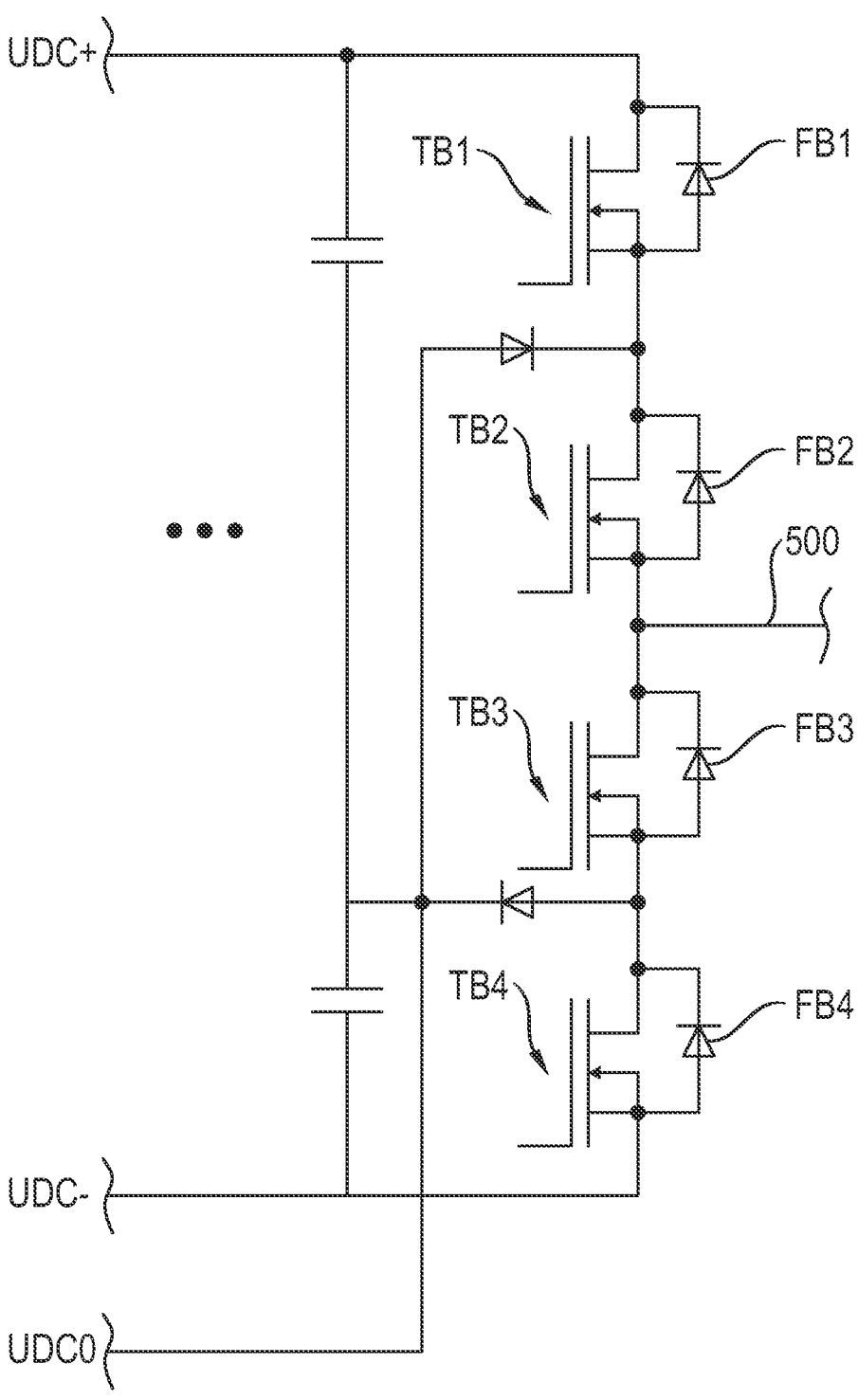
FIG. 5 shows a circuit diagram of a bridge of the inductance emulator.
Figure 6:
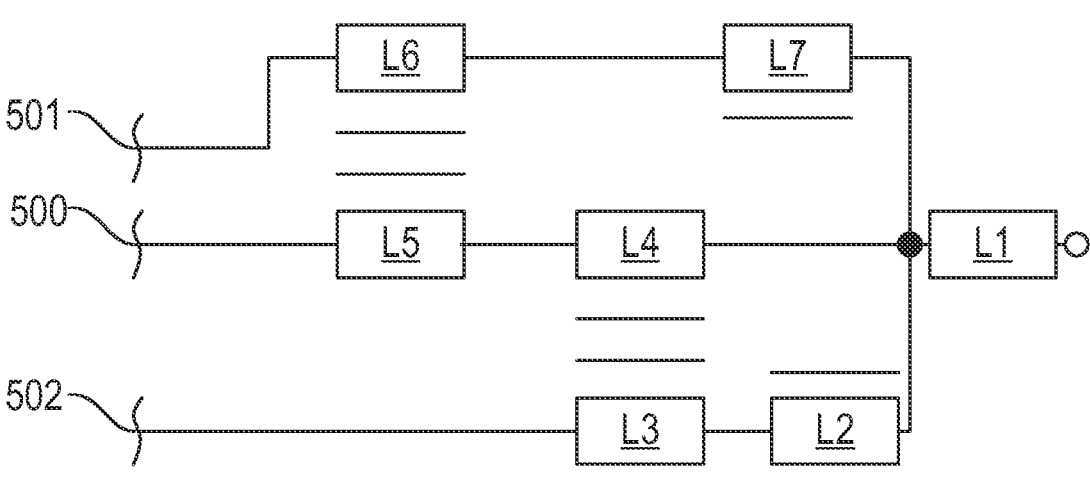
FIG. 6 shows an inductance network.

FIG. 5 shows a circuit diagram where the inductance emulator IE is represented with respect to a bridge. In addition to the bridge shown, there are other bridges connected in parallel, for example, three bridges can be connected in parallel to each other. For example, the structure shown can correspond to a 3L NPC bridge. The bridge shown is connected to an inductance network via the tap 500, which is shown in FIG. 6.

The bridge shown here has four circuit breakers TB1 to TB4, each of which has a freewheel diode, FB1 to FB4, connected in parallel. The reference potential UDC0 is connected between the TB1 and TB2 circuit breakers or the TB3 and TB4 circuit breakers. Through conductor end switching of TB1 and TB2, the potential UDC+ can be made available at the tap 500. By conductor end switching of TB3 and TB4, the potential UDC can be provided at the tap 500.

A DC link of the circuit has two capacitors between the voltages UDC+ and UDC−. The DC link is split and has a connection to the reference potential UDC0 in the middle between the two capacitors. Two diodes are provided between the reference potential UDC0 and the connections between the respective circuit breakers. Via the diodes, the center potential of the DC link UDC0 can be made available at the tap 500 by conductor end switching of TB2 and TB3 and blocking of TB1 and TB4.

Other bridges connected in parallel—not shown in FIG. 4—can be constructed accordingly. If they are formed like the bridge shown, they can also provide these three potentials at their respective taps 501, 502.

FIG. 6 shows—connected to the coupling inductor L1—three branches of an inductance network with the inductors L2 to L7. These inductors L2 to L7 have iron cores. The lines also show iron cores that are assigned to the inductors L2 to L7. The respective inductors L5/L6, L3/L4 and L2/L7 are magnetically coupled via the iron cores. The coupling inductor L1 is connected to the controller SG.

Each branch of this inductance network is provided as an example for a bridge of the inductance emulator IE, as shown in FIG. 5 as an example of such a bridge. The bridge shown in FIG. 5 is connected to the inductance network via the tap 500. Further bridges are connected to the inductance network via the taps 501 and 502, so that the three partial currents of the three branches are then brought together via the coupling inductor L1.

The bridge shown in FIG. 5 supplies the middle branch 500 of the inductance network of FIG. 6 having the inductors L4 and L5 with a current that is combined with the other two branches.

The other two branches, 501 and 502 are each supplied with electricity by the other two bridges. Therefore, the sum current of the three branches flows through the coupling inductor L1 to the output A.

The inductance network, formed of the coupled inductors L5/L6, L3/L4 and L2/L7, has two basic functions. Initially, it is intended to prevent cross-currents between the parallel bridges. It also serves as an inductive voltage divider to combine the 3 discrete voltages of each bridge, in the example of an 3L NPC bridge. With the help of this voltage divider, a 7-level topology is created by combining, e.g., three bridges. In front of the series inductor L1, seven discrete voltage levels can be switched by combining different voltage levels from the different bridges, e.g., as a control voltage UCTRL.

If the inductance emulator is to act as a voltage source, a capacitor could be switched instead of or in addition to the coupling inductor L1.

Figure 7:
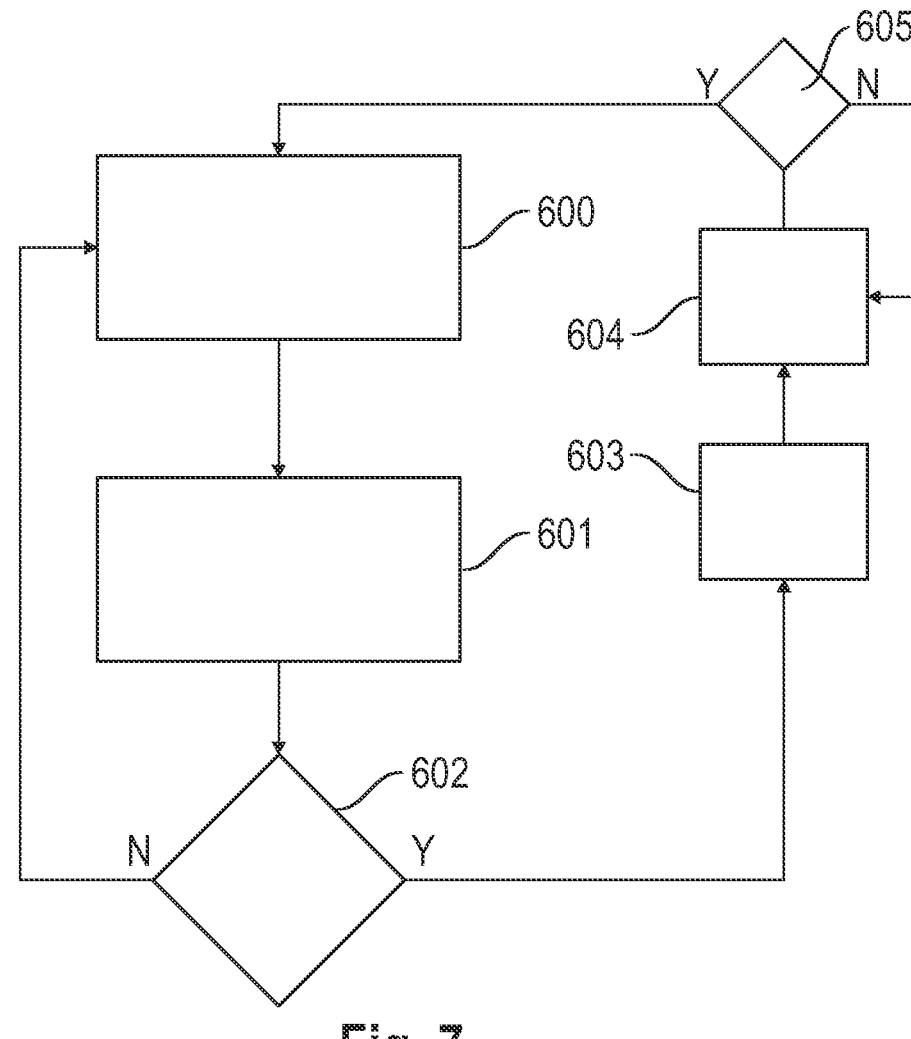
FIG. 7 shows a flow diagram of the method.

FIG. 7 shows the method according to the invention in a flowchart. In method step 600, the inductance emulator IE is used to determine which current I the inductance emulator IE should deliver via its bridge circuit based on the output voltage UDOUT of the controller SG. In method step 601, the test device PE is used for this purpose, which in method step 602 determines whether the current I derived from the output voltage UDOUT in step 601 is within a range between the threshold values TH1 and TH2. If the current I is within this range, no activity takes place until the output voltage UDOUT is stable and then it is measured whether said output voltage is above the further threshold value TH3.

If the output voltage UDOUT is below the further threshold value TH3, there is an inverter lock, so that in method step 603 the inductance emulator IE is switched to a different operating mode, e.g., is switched off.

If the analysis does not show this, i.e., if the output voltage is above the further threshold value TH3, the system reverts from method step 602 to method step 600. If the inductance emulator IE has been switched to the other operating mode in method step 603, the test device PE will then further analyze in method steps 604 whether the output voltage UDOUT of the controller SG or the measuring voltage UM indicates that normal operation will resume after the inverter lockout. This is especially the case if the output voltage rises again above the further threshold value TH3. If this is detected in method steps 605, the system jumps back to method steps 600. If this is not detected, i.e., the state of the inverter lock is still decisive, the system jumps back to method step 604 and analyzes further.

Figure 8:
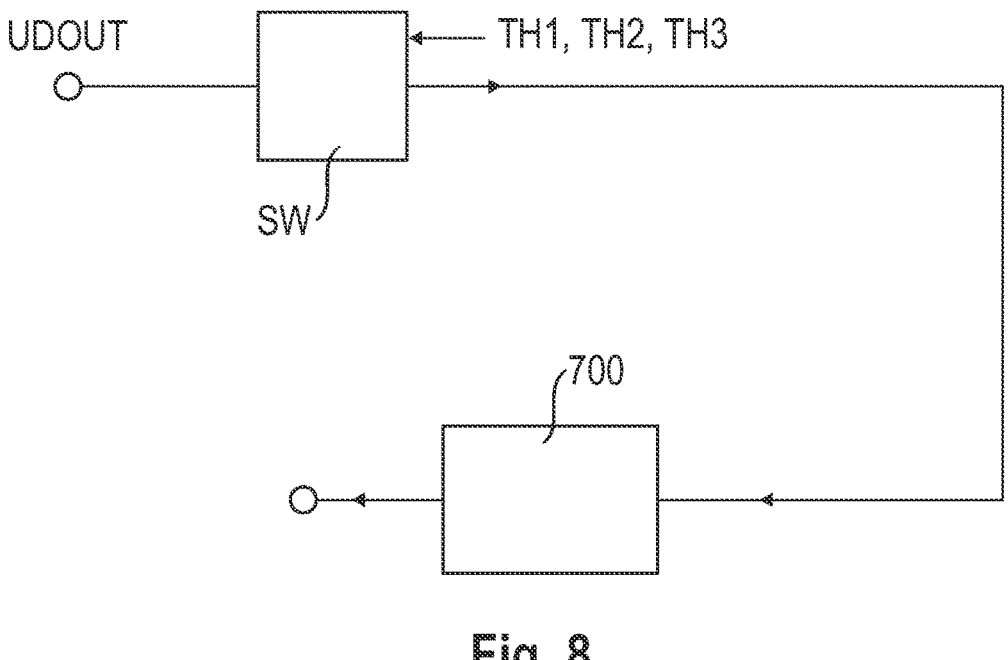
FIG. 8 shows another block diagram.

In a block diagram, FIG. 8 shows the processing or analysis of the output voltage UDOUT of the controller SG or the dependent measuring voltage UM or the dependent phase current I. The phase current and the output voltage are fed to the threshold decider SW. In the threshold decider SW, the parameter dependent on the output voltage UDOUT can be compared with the first and second threshold values TH1, TH2 and the output voltage UDOUT can be compared with the further threshold value TH3.

In method step 700, a decision is then made as to whether this analysis leads to a change in the operating mode of the inductance emulator IE, e.g., to its shutdown.

Figure 9:
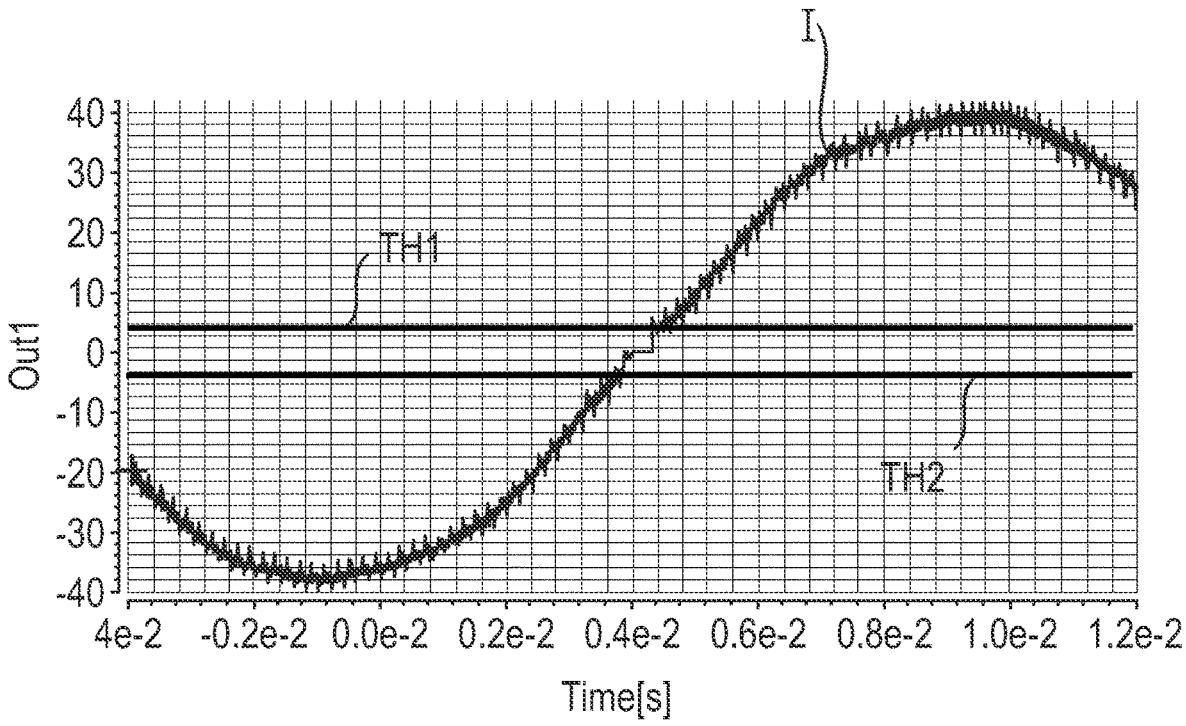
FIG. 9 shows a current/time diagram.

FIG. 9 shows in a current/time diagram of the phase current I output from the inductance emulator IE to the controller SG.

The voltage UDOUT is evaluated. In the zero crossing of current I, the inductance emulator IE should be deactivated in order to be able to correctly evaluate the amplitude of the output voltage UDOUT.

Based on this assessment, it is decided whether the inductance emulator IE remains inactive because the controller SG is inactive or whether it is reactivated after the measurement because the controller SG is active. The temporary disabling of the inductance emulator IE for the purpose of correctly evaluating the output voltage UDOUT can be seen in the diagram shown by the fact that the current I remains flat at zero around the zero crossing.

The method for this is as follows:

If the current I is less than the first and second threshold value TH1, TH2, the inductance emulator IE is disabled. This can be seen by the fact that current I remains flat at zero near the zero crossing of the sine wave.

Then the system waits until the output voltage UDOUT of the controller SG is in a stable state and then the output voltage UDOUT of the controller SG is measured.

It is then evaluated whether the output voltage of the controller UDOUT is lower than the further threshold value TH3. If so, the inactive controller SG is detected and the inductance emulator IE remains inactive. If the output voltage UDOUT of the controller SG is greater than the further threshold value TH3, the inductance emulator IE is reactivated and the emulation of the phase currents by the inductance emulator IE continues.

This can be seen in the diagram of FIG. 9 by the fact that at a certain distance from the zero crossing of current I, the current again follows the sinusoidal curve.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A test arrangement to emulate phase currents of an electric motor to test a power electronics controller that is adapted to drive the electric motor and is connectable to the test arrangement, the test arrangement comprising:
   an inductance emulator to simulate the electric motor as an electrical load for the controller via a power electronics circuit; and
   a test device to switch the inductance emulator to a different operating mode depending on an analysis of a parameter that depends on an output voltage at an output of the controller.

2. The test arrangement according to claim 1, wherein the inductance emulator acts as the power source.

3. The test arrangement according to claim 1, wherein the inductance emulator is switched off in the different mode of operation.

4. The test arrangement according to claim 3, wherein the inductance emulator acts as a voltage source in the different mode of operation.

5. The test arrangement according to claim 1, wherein the test arrangement feeds a current into the output of the controller that depends on the output voltage of the controller and that was generated by the inductance emulator.

6. The test arrangement according to claim 1, wherein the test device comprises a threshold decider that compares a parameter dependent on the output voltage of the controller with at least one threshold value, and wherein the test device is set up to switch the inductance emulator to the different mode of operation depending on this comparison.

7. The test arrangement according to claim 6, wherein the threshold decider compares the parameter dependent on the output voltage of the controller with two threshold values that lie on different sides of a zero crossing of the parameter.

8. The test arrangement according to claim 7, wherein the test device switches the inductance emulator to the different mode of operation when a value is between the two threshold values.

9. The test arrangement according to claim 8, wherein the test device compares a further parameter dependent on the output voltage of the controller with a further threshold value and, depending on this comparison, switches the mode of operation of the inductance emulator so that the different mode of operation is exited, wherein the further parameter is in particular the output voltage of the controller.

10. The test arrangement according to claim 6, wherein the parameter of the current generated by the inductance emulator and/or the further parameter is the output voltage of the controller.

11. The test arrangement according to claim 1, wherein the test device has a resistor network that is connectable to the output of the controller, and wherein the resistor network draws the output voltage of the controller to a predetermined potential when the inductance emulator is switched off.

12. The test arrangement according to claim 11, wherein the resistor network has at least one ohmic resistor via which the test device detects the output voltage of the controller.

13. The test arrangement according to claim 11, wherein the resistor network has two ohmic resistors connected symmetrically to the output of the controller, and wherein the two resistors have the same resistance value.

14. The test arrangement according to claim 1, wherein the inductance emulator is connected to the controller via an inductance network.

15. The test arrangement according to claim 1, wherein the power electronics circuit has at least one bridge circuit with semiconductor circuit breakers or three parallel connected bridge circuits with semiconductor circuit breakers.

16. The test arrangement according to claim 1, wherein the test arrangement has a respective inductance emulator and a respective test device per phase of the electric motor.

17. The test arrangement according to claim 1, wherein the inductance emulator is switched to a different operating mode from a normal operating mode, wherein, in the normal operating mode, the inductance emulator provides phase currents, and wherein, in the different operating mode, the inductance emulator does not provide phase currents.

18. A method to emulate phase currents of an electric motor via a test arrangement to test a controller that is adapted to drive the electric motor and is connectable to the test arrangement, the method comprising:
   providing an inductance emulator to simulate the electric motor as an electrical load for the controller via a power electronics circuit; and providing a test device that switches the inductance emulator to a different mode of operation depending on an analysis of an output voltage of the controller.

* * * * *